United States Patent
Sansa Perna et al.

(10) Patent No.: US 11,834,329 B2
(45) Date of Patent: Dec. 5, 2023

(54) SENSOR CONTROL METHOD

(71) Applicant: Commissariat à l'Energie Atomique et aux Energies Alternatives, Paris (FR)

(72) Inventors: Marc Sansa Perna, Grenoble (FR); Martial Defoort, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 301 days.

(21) Appl. No.: 17/301,326

(22) Filed: Mar. 31, 2021

(65) Prior Publication Data

US 2021/0309510 A1  Oct. 7, 2021

(30) Foreign Application Priority Data

Apr. 3, 2020 (FR) ...................... 2003380

(51) Int. Cl.
  *B81B 7/00* (2006.01)
  *B81B 7/02* (2006.01)
  *G02F 1/01* (2006.01)

(52) U.S. Cl.
  CPC ............. *B81B 7/007* (2013.01); *B81B 7/02* (2013.01); *G02F 1/0123* (2013.01);
  (Continued)

(58) Field of Classification Search
  CPC ............. G02F 1/0123; G01C 19/5726; G01C 19/5776; G01C 19/56; B81B 7/007; B81B 7/02; B81B 7/008; B81B 2207/03; B81B 2201/0235; B81B 2201/0242; G01P 15/13; G01P 15/097; G01P 15/131; G01P 15/125; G01P 15/093; G01P 15/132; G01P 2015/0865; G01P 2015/0882; G01R 33/09; G01R 33/07; G01R 33/0023; G01R 27/2611; G01B 7/003; G01B 21/16; G01D 5/145; G01D 5/14; G01D 5/20; H01L 29/84; B25J 9/1635; B25J 9/1664;
  (Continued)

(56) References Cited

U.S. PATENT DOCUMENTS

2004/0149035 A1\* 8/2004 Acar .................. G01C 19/5719
  74/5.6 D
2006/0033588 A1\* 2/2006 Caminada .......... G01C 19/5726
  331/154

(Continued)

FOREIGN PATENT DOCUMENTS

EP   3301398 A1   4/2018

OTHER PUBLICATIONS

Preliminary Search Report for French Application No. 2003380 dated Dec. 17, 2020, 2 pages.

(Continued)

*Primary Examiner* — Mouloucoulaye Inoussa
(74) *Attorney, Agent, or Firm* — Moreno IP Law LLC

(57) ABSTRACT

The present description concerns a microelectromechanical sensor control method, including the steps of: exciting, with same first signal (FSL), a first resonant (206L) and at least one second resonant element (206R); and estimating a phase shift (Δφ) between the first signal and a second signal (FSR) which is an image of vibrations of the second resonant element.

16 Claims, 4 Drawing Sheets

(52) U.S. Cl.
CPC ............. *B81B 2201/0235* (2013.01); *B81B 2201/0242* (2013.01); *B81B 2207/03* (2013.01)

(58) Field of Classification Search
CPC . G06F 1/12; G06F 1/10; H03L 7/0807; H03L 7/1075; H03L 2207/50; H03K 5/082; H03K 5/133; H03K 2005/00143; H04B 1/16; H03H 9/02338; H03H 9/02275; H03B 5/30; G01V 1/18; G01V 1/181; G01V 1/182; G01H 9/006; G05B 2219/41217; G05B 2219/41226; G05B 2219/41231
USPC ....... 73/504.12; 356/72; 318/9, 116; 331/15, 331/1 R, 154
See application file for complete search history.

(56) References Cited

U.S. PATENT DOCUMENTS

| | | | |
|---|---|---|---|
| 2006/0208169 A1* | 9/2006 | Breed | G01S 17/88 250/221 |
| 2008/0106351 A1* | 5/2008 | Prandi | H03H 9/02409 310/309 |
| 2009/0064781 A1 | 3/2009 | Ayazi et al. | |
| 2010/0259318 A1* | 10/2010 | Bien | G01C 19/5776 327/551 |
| 2010/0315170 A1* | 12/2010 | Locascio | H03L 7/00 331/1 R |
| 2012/0262241 A1* | 10/2012 | Phan Le | H03H 9/02448 331/154 |
| 2013/0025368 A1* | 1/2013 | Donadel | G01C 19/5726 73/504.12 |
| 2013/0031950 A1* | 2/2013 | Donadel | G01C 19/5776 73/1.77 |
| 2013/0249642 A1* | 9/2013 | Rizzo Piazza Roncoroni | H03L 3/00 331/156 |
| 2014/0000366 A1* | 1/2014 | Blomqvist | G01C 19/5776 73/504.12 |
| 2014/0001984 A1* | 1/2014 | Kuisma | G01P 15/097 318/116 |
| 2014/0117883 A1* | 5/2014 | Selden | B60N 2/501 318/9 |
| 2014/0144330 A1* | 5/2014 | Huang | A47J 31/46 99/300 |
| 2014/0208823 A1 | 7/2014 | Trusov et al. | |
| 2014/0262241 A1* | 9/2014 | Rees | E21B 43/2408 166/305.1 |
| 2015/0042981 A1* | 2/2015 | Onaran | G01P 15/093 356/72 |
| 2015/0143905 A1* | 5/2015 | Kuisma | H03H 9/02338 73/504.12 |
| 2015/0176992 A1* | 6/2015 | Entringer | G01C 19/567 73/504.12 |
| 2016/0334213 A1* | 11/2016 | DeWall | G01C 19/5776 |
| 2016/0349056 A1* | 12/2016 | Thompson | B81C 99/0045 |
| 2017/0006386 A1* | 1/2017 | Margalit | H04R 3/04 |
| 2018/0058854 A1* | 3/2018 | Suzuki | G01C 19/5726 |
| 2018/0183354 A1* | 6/2018 | Wischnewskiy | H02N 2/062 |
| 2018/0245972 A1* | 8/2018 | Cermak | G01H 13/00 |
| 2018/0266823 A1* | 9/2018 | Jandak | G01C 19/5755 |
| 2018/0340986 A1* | 11/2018 | Latham | G01R 33/09 |
| 2018/0340987 A1* | 11/2018 | Latham | G01R 33/032 |
| 2018/0340988 A1* | 11/2018 | Latham | G01D 5/2013 |
| 2018/0340989 A1* | 11/2018 | Latham | G01R 33/06 |
| 2018/0340990 A1* | 11/2018 | Latham | G01R 33/098 |
| 2019/0007055 A1* | 1/2019 | Nelson | G06F 1/12 |
| 2019/0351770 A1* | 11/2019 | Zhou | B60L 15/2045 |
| 2020/0171658 A1* | 6/2020 | Kielsholm Thomsen | B25J 9/1664 |
| 2020/0408526 A1* | 12/2020 | Matsudaira | G01C 25/00 |
| 2021/0140995 A1* | 5/2021 | Reinke | G01P 15/125 |

OTHER PUBLICATIONS

Tsai, N-C. et al., "Fabrication and analysis of a micro-machined tri-axis gyroscope," J. Micromech. Microeng., vol. 18, 115014 (2008), 14 pages.

* cited by examiner

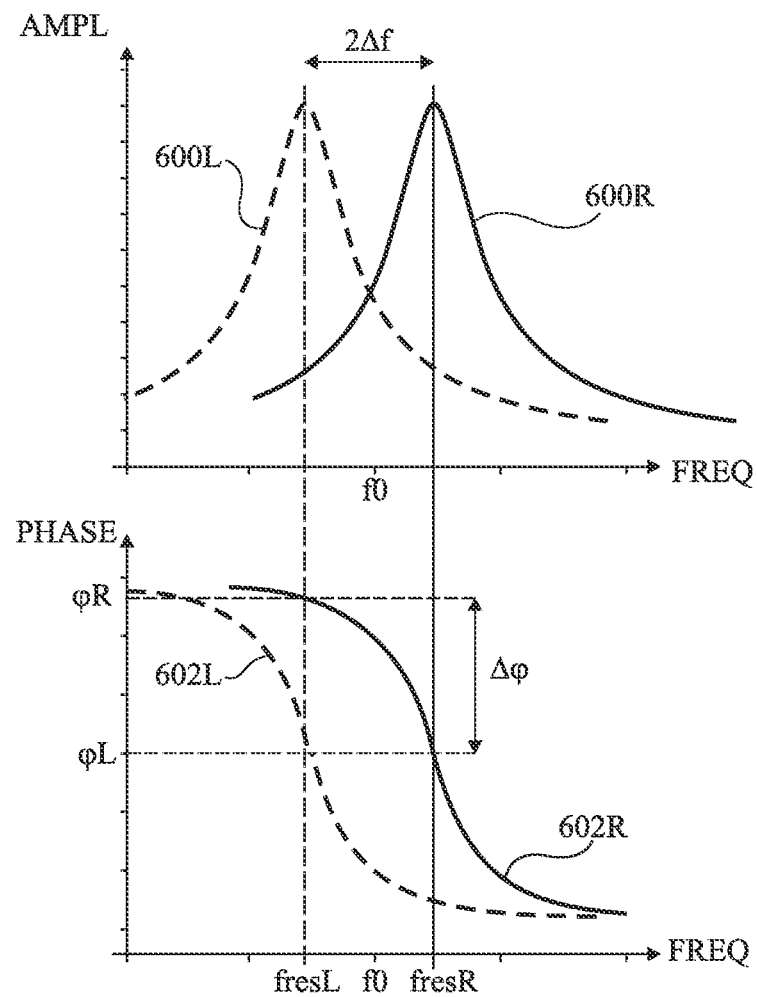
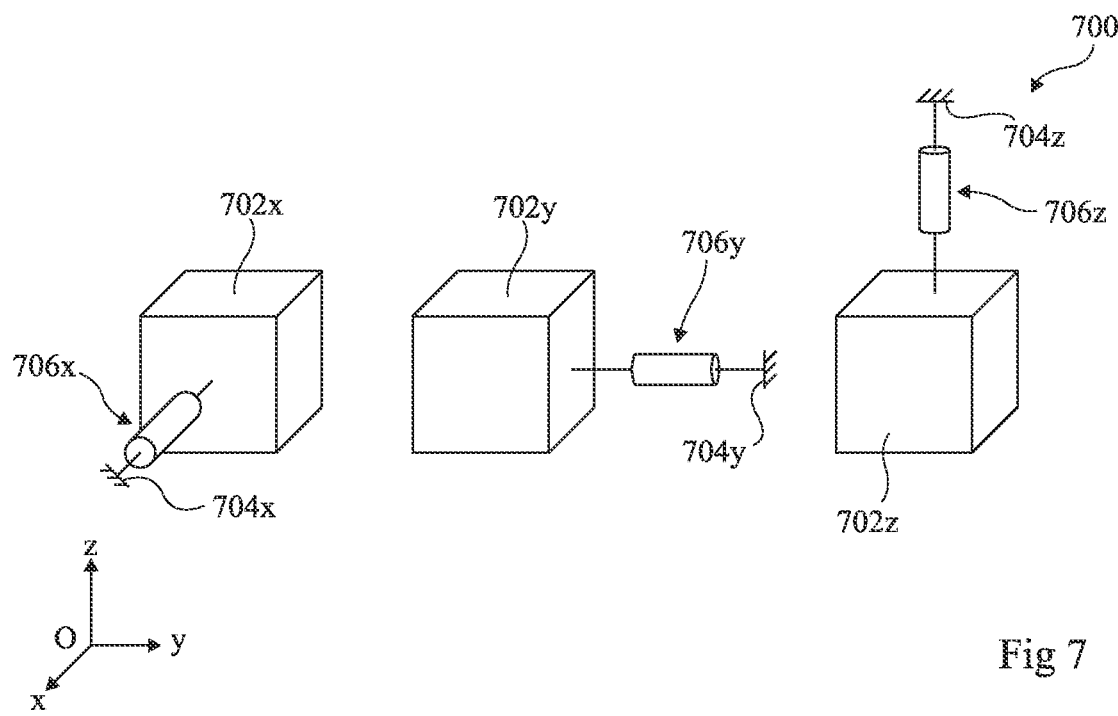
Fig 6
Fig 7

SENSOR CONTROL METHOD

FIELD

The present disclosure generally concerns electronic devices and, more particularly, sensors based on microelectromechanical systems (MEMS) and their control methods.

BACKGROUND

A sensor based on a microelectromechanical system, or MEMS sensor, typically comprises a micrometer-range mechanical element sensitive to a physical quantity, for example, to an acceleration, to an angular speed, to a force, etc. This mechanical element is generally associated with one or a plurality of transduction elements, or transducers, capable of converting motions of the mechanical element into electric or optical signals representative of the physical quantity to be measured.

In usual MEMS sensors, electronic circuits particularly enable to control the transduction elements and to process the signals originating therefrom. Such circuits are often complex and expensive to form.

SUMMARY

There is a need to improve the circuits of existing MEMS sensors.

An embodiment overcomes all or part of the disadvantages of the circuits of known MEMS sensors.

An embodiment provides a method of controlling a microelectromechanical sensor, comprising the steps of:
 exciting, with a same first signal, a first resonant element and at least one second resonant element; and
 estimating a phase shift between the first signal and a second signal which is an image of vibrations of the second resonant element.

According to an embodiment, the first signal is periodic, and has a frequency substantially equal, preferably equal, to a resonance frequency of the first resonant element.

According to an embodiment, the second resonant element has, when the sensor is in a position of equilibrium, a resonance frequency substantially equal, preferably equal, to the resonance frequency of the first resonant element.

According to an embodiment, the first signal is imposed to the first resonant element by a feedback loop.

According to an embodiment, the phase shift is estimated by a phase detector specific to each second resonant element.

According to an embodiment, the sensor comprises one or a plurality of seismic masses, each second resonant element being coupled to said or to one of said seismic masses.

According to an embodiment, the method further comprises a step of exerting a feedback force on each seismic mass.

According to an embodiment, the feedback force is generated by a feedback loop comprising a regulator, preferably a proportional and/or integral and/or derivative regulator, more preferably a proportional integral derivative regulator.

According to an embodiment, the first resonant element is mechanically uncoupled from said seismic mass(es).

An embodiment provides a circuit adapted to implementing the method such as described.

An embodiment provides a microelectromechanical sensor comprising at least one circuit such as described.

An embodiment provides a one-axis sensor, comprising exactly one second resonant element and one phase detector.

An embodiment provides a three-axis sensor, comprising exactly three second resonant elements and three phase detectors.

An embodiment provides an accelerometer comprising at least one sensor such as described.

An embodiment provides a gyrometer comprising at least one sensor such as described.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIG. 6 comprises graphs showing other curves characteristic of the accelerometer of FIG. 2;

FIG. 7 is a partial simplified perspective view of still another example of an accelerometer of the type to which described embodiments apply as an example.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the applications and devices where the described sensors are likely to be implemented are not detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

Unless specified otherwise, the expressions "around", "approximately", "substantially" and "in the order of" signify within 10%, and preferably within 5%.

Figure 1:
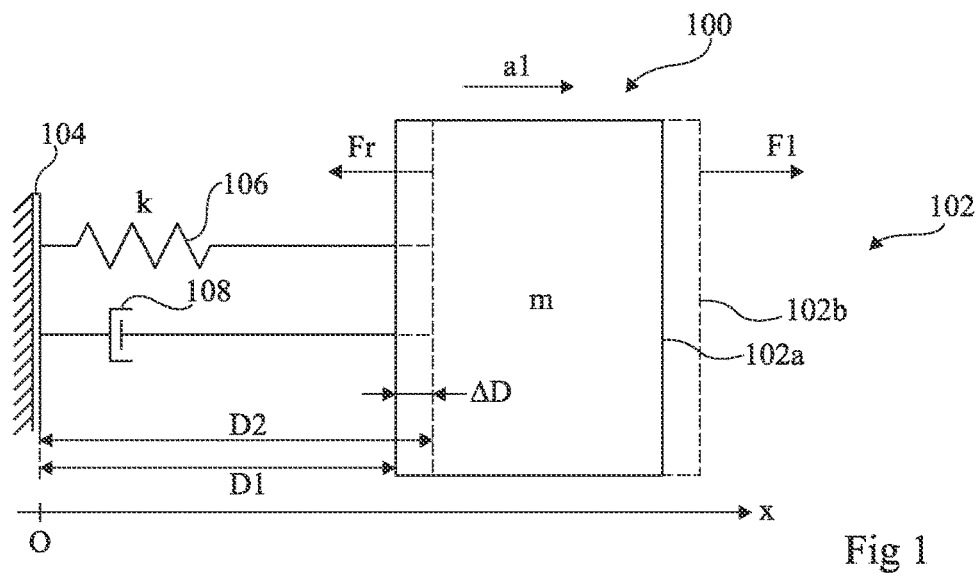
FIG. 1 very schematically and partially shows an example of an accelerometer.

FIG. 1 very schematically and partially shows an example of an accelerometer 100.

In the example of FIG. 1, accelerometer 100 comprises a proof body 102, for example, a seismic mass of mass m. Seismic mass 102 is coupled to a fixed element or anchoring 104 by a spring 106, having a stiffness constant k, and by a damper 108 assembled in parallel with spring 106. In the simplified representation of FIG. 1, damper 108 enables to model dynamic losses or damping phenomena, for example, friction losses, capable of affecting the operation of accelerometer 100.

At rest, in other words, in the absence of acceleration, seismic mass 102 is separated from anchoring 104 by a distance D1. In FIG. 1, the position of seismic mass 102 at rest is symbolized by a rectangle 102a in full lines.

When seismic mass 102 is drawn away from position 102a, for example, under the effect of a force F1 resulting from an acceleration a1, spring 106 then exerts, on seismic mass 102, a force Fr. In the case illustrated in FIG. 1 where force F1 tends to draw seismic mass 102 away from anchoring 104, force Fr is a pull-back force opposing force F1, that is, tending to bring seismic mass 102 closer to anchoring 104.

Assuming that acceleration a1 is constant, seismic mass 102 then reaches a position of static equilibrium, symbolized in FIG. 1 by a rectangle 102b in dotted lines, where the pull-back force Fr compensates for force F1. Forces Fr and F1 are in this case of same value and of same direction, parallel to a horizontal axis Ox, but of opposite orientation.

In equilibrium position 102b, seismic mass 102 is separated from anchoring 104 by a distance D2, greater than distance D1. By measuring the displacement of seismic mass 102, in other words by estimating an interval AD between distances D1 and D2, one can then, knowing mass m and stiffness constant k, deduce the acceleration a1 undergone by the seismic mass 102 of accelerometer 100.

In the rest of the description, the resolution of an accelerometer designates the minimum acceleration likely to be detected by this accelerometer. In other words, the resolution of an accelerometer corresponds to the smallest force, or to the minimum displacement, detectable by this accelerometer.

Figure 2:
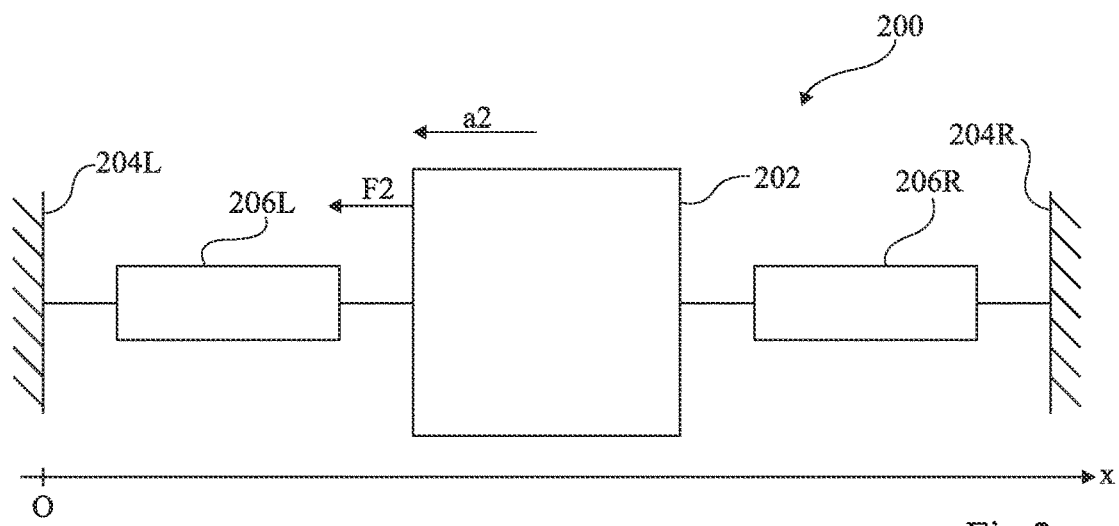
FIG. 2 is a partial simplified side view of another example of an accelerometer of the type to which described embodiments apply as an example.

FIG. 2 is a partial simplified side view of another example of an accelerometer 200 of the type to which described embodiments apply as an example.

In the example of FIG. 2, accelerometer 200 comprises a seismic mass 202 similar to the seismic mass 102 of accelerometer 100 (FIG. 1). In FIG. 2, seismic mass 202 is coupled to fixed elements or anchorings 204L and 204R by transduction elements 206L and 206R, or transducers. Transduction elements 206L and 206R are for example resonant elements or resonators, for example, resonant beams. In the orientation of FIG. 2, resonant elements 206L and 206R are located on either side of mass 202 along a horizontal axis Ox, so that resonant element 206L, 206R couples seismic mass 202 to anchoring 204L, 204R. In other words, each resonant element 206L, 206R is coupled, on the one hand to seismic mass 202, and on the other hand to anchoring 204L, 204R.

In this example, accelerometer 200 is capable of only detecting accelerations which have a non-zero component when projected on axis Ox. However, accelerometer 200 is not capable of detecting accelerations which have a zero component along axis Ox, in other words accelerations perpendicular to axis Ox (for example, upward or downward accelerations, in the orientation of FIG. 2). Accelerometer 200 is then called one-axis sensor, or single-axis sensor.

The seismic mass 202 and/or the resonant elements 206L and 206R of accelerometer 200 are for example microelectromechanical systems (MEMS). In other words, seismic mass 202 and/or resonant elements 206L and 206R for example have at least one micrometer-range dimension, that is, a dimension typically in the range from ten micrometers (10 μm) to several hundreds of micrometers, for example, from ten micrometers (10 μm) to one hundred micrometers (100 μm).

Resonant elements 206L and 206R are, for example, cylindrical beams (in side view in FIG. 2). As an example, each beam 206L, 206R has a diameter in the order of several hundred nanometers, for example, equal to approximately two hundred and fifty nanometers (250 nm). Beams 206L and 206R are then called nanoelectromechanical systems (NEMS).

As a variant, each bam 206L, 206R is a MEMS beam. Each beam 206L, 206R then for example has a diameter in the order of several tens of micrometers, for example, equal to approximately fifty micrometers (50 μm).

At rest, seismic mass 202 is located at an equal distance from anchorings 204L and 204R, assuming, for simplification, that resonant elements 206L and 206R are identical, to within manufacturing dispersions. Resonant elements 206L and 206R are thus submitted to an equivalent stress when seismic mass 202 is at rest. Resonant elements 206L and 206R are for example each submitted to a same mechanical tension, this tension being sufficient to hold seismic mass 202 suspended above a support (not shown in FIG. 2).

When seismic mass 202 is submitted to a force F2 resulting, for example, from an acceleration a2 oriented towards anchoring 204L (that is, leftwards in the orientation of FIG. 2), seismic mass 202 then tends to come closer to anchoring 204L and to draw away from anchoring 204R. Force F2 thus exerts an axial stress, that is, parallel to axis Ox, on resonant elements 206L and 206R. More precisely, in the case where force F2 is oriented towards anchoring 204L, resonant element 206L is submitted to compressive stress, while resonant element 206R is submitted to extension stress.

The accelerometer 200 of FIG. 2 generally enables to reach a resolution greater than that of the accelerometer 100 of FIG. 1. The operation of accelerometer 200 is detailed hereafter in relation with FIGS. 3 and 4.

Figure 3:
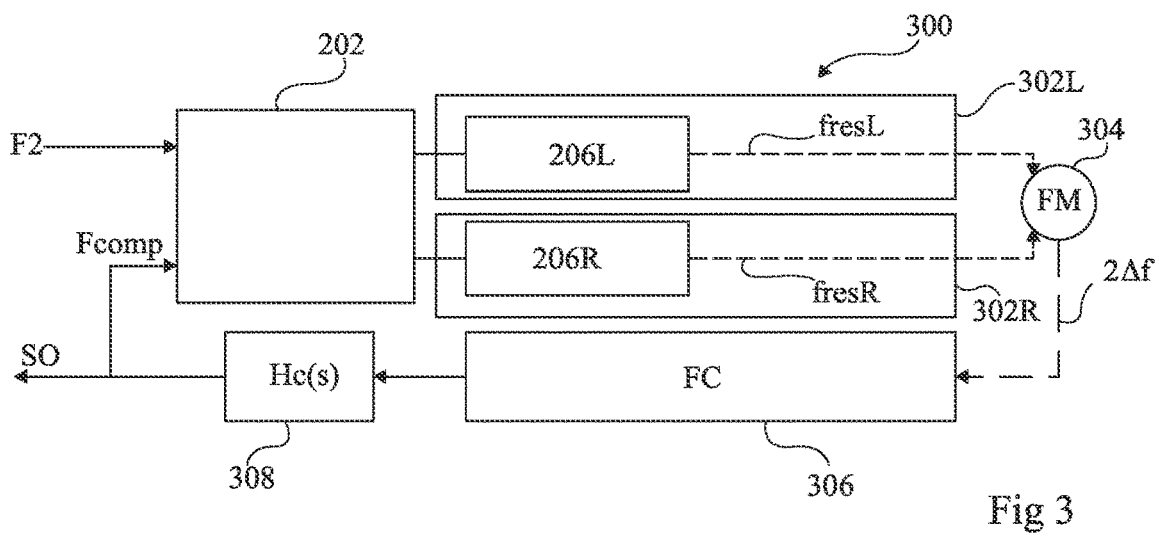
FIG. 3 schematically shows in the form of blocks an example of a sensor control circuit.

FIG. 3 schematically shows, in the form of blocks, an example of a sensor control circuit 300. Control circuit 300 for example forms part of, or is associated with, the accelerometer 200 of FIG. 2.

In FIG. 3, one has symbolized:
in full lines, links conveying analog signals x(t) enabling to code information in the form of an amplitude; and
in dotted lines, links conveying other analog signals x(t) enabling to code information in the form of a frequency.

As an example, the signals x(t) symbolized by full lines in FIG. 3 are of the type:

$$x(t)=B1+a(t) \qquad (1)$$

In the above equation 1, B1 represents a constant and a(t) represents an amplitude, variable according to time t.

As an example, the signals x(t) symbolized by dotted lines in FIG. 3 are of the type:

$$x(t)=B2\cos(2\pi \times f(t) \times t) \qquad (2)$$

In the above equation 2, B2 represents a constant and f(t) represents a frequency, variable according to time t.

The transmitted information is located in the variable portion, that is, the amplitude variation a(t) or the frequency variation f(t).

In the rest of the description, the expression control circuit of a sensor designates an electronic circuit configured to control or drive components of this sensor, for example, transduction elements or resonant elements, and/or to process signals originating from these transduction elements or resonant elements to generate, at the output, one or a plurality of measurement signals.

Control circuit 300 comprises blocks 302L and 302R, each symbolizing a source of a periodic signal of adjustable frequency. When accelerometer 200 is operating, feedback loop 302L, 302R delivers a periodic excitation signal having its frequency adjusted to have resonant element 206L, 206R vibrate at closest to its resonance frequency fresL, fresR.

In the case where accelerometer 200 is in a position of equilibrium, resonant elements 206L and 206R, assumed to be identical, have respective resonance frequencies fresL and fresR of same value, noted f0. In the equilibrium position, feedback loop 302L, 302R thus excites resonant element 206L, 206R at a resonance frequency value fresL, fresR equal to f0.

In the case where seismic mass 202 is submitted to accelerations, the stress exerted on resonant elements 206L and 206R under the action of the lateral displacements of seismic mass 202 cause frequency variations of the respective resonance frequencies fresL and fresR of resonant elements 206L and 206R out of the equilibrium position. The feedback loops 302L and 302R of the circuit 300 of accelerometer 200 are configured to adapt to these variations of resonance frequencies fresL and fresR, in other words to adjust the frequencies of the excitation signals of resonant elements 206L and 206R so that they correspond to frequencies fresL and fresR.

Feedback loop 302L, 302R is in particular configured so that resonant element 206L, 206R is excited at its resonance frequency freL, fresR whatever the acceleration undergone by seismic mass 202, in other words whatever the stress exerted on resonant element 206L, 206R. It is then said that accelerometer 200 operates in resonant detection mode.

By estimating an interval or offset, noted Δf, of each resonance frequency fresL, fresR out of the equilibrium position with respect to the resonance frequency f0 at equilibrium, the acceleration a2 undergone by seismic mass 202 can be deduced. Offset Δf is for example estimated due to a frequency mixer 304 (FM). In the example of FIG. 3, a value 2Δf, corresponding to twice offset Δf, that is, to the difference between the two resonance frequencies fresL and fresR out of the equilibrium position, is transmitted to a frequency counter 306 (FC). At the output of frequency counter 306, an electric signal proportional to acceleration a2 is for example obtained.

More generally, frequency counter 306 is for example adapted to converting an analog signal enabling to code information in frequency form into another analog signal enabling to code this information, or an image of this information, in amplitude form.

In practice, resonance frequency fresL, fresR is searched by estimating an amplitude of the vibrating motion of each resonant element 206L, 206R due to at least one transduction element, for example, piezoresistive. As an example, a piezoresistive gauge (not shown) is coupled to each resonant element 206L, 206R to obtain a resistive signal proportional to its vibration amplitude. As a variant, the vibrations of each resonant element 206L, 206R are for example converted into an analog signal by a capacitive transducer.

The resonant detection implemented by circuit 300 enables to access an improved dynamic range and is less likely to be impacted by temperature variations, particularly as compared with other readout methods, for example, capacitive or piezoresistive, where elements 206L and 206 do not resonate. Circuit 300 is however often complex and expensive, since it comprises a feedback loop 302L, 302R for each resonant element 206L, 206R and a frequency counter 306 generally comprising a highly-accurate synchronization signal and digital signal processing interfaces (not shown in FIG. 3).

Resonant detection accelerometers are sometimes usable in limited acceleration ranges having their limiting values linked to mechanical constraints, for example, to buckling capacity limits or to the rupture of resonant elements 206L and 206R. To do away with these constraints, a control circuit comprising a force feedback loop is most often used. This further enables to avoid or limit parasitic resonances of the seismic mass of the considered accelerometer.

In circuit 300, such a feedback loop is for example obtained due to a block 308 (Hc(s)) symbolizing a regulator or corrector which applies, at the output of frequency counter 306, a transfer function Hc(s). Regulator 308 is for example a proportional integral derivative regulator or PID regulator. Regulator 308 is configured to exert a compensation force Fcomp, or feedback force, on seismic mass 202.

Compensation force Fcomp for example has an amplitude equal and a direction opposite to that of force F2 (FIG. 2). In other words, circuit 300 adjusts the amplitude and the direction of compensation force Fcomp, along the acceleration variations undergone by the seismic mass 202 of accelerometer 200, to compensate for force F2. Compensation force Fcomp thus enables, despite the action of force F2, to bring seismic mass 202 towards or back to its equilibrium position, which results in decreasing or in releasing the mechanical stress exerted on resonant elements 206L and 206R.

In practice, compensation force Fcomp is for example an electrostatic force exerted on seismic mass 202 by one or a plurality of electrodes (not shown). In the example of FIG. 3, circuit 300 generates an output signal SO which is for example equal or proportional to an electric voltage used to apply electrostatic force Fcomp.

Figure 4:
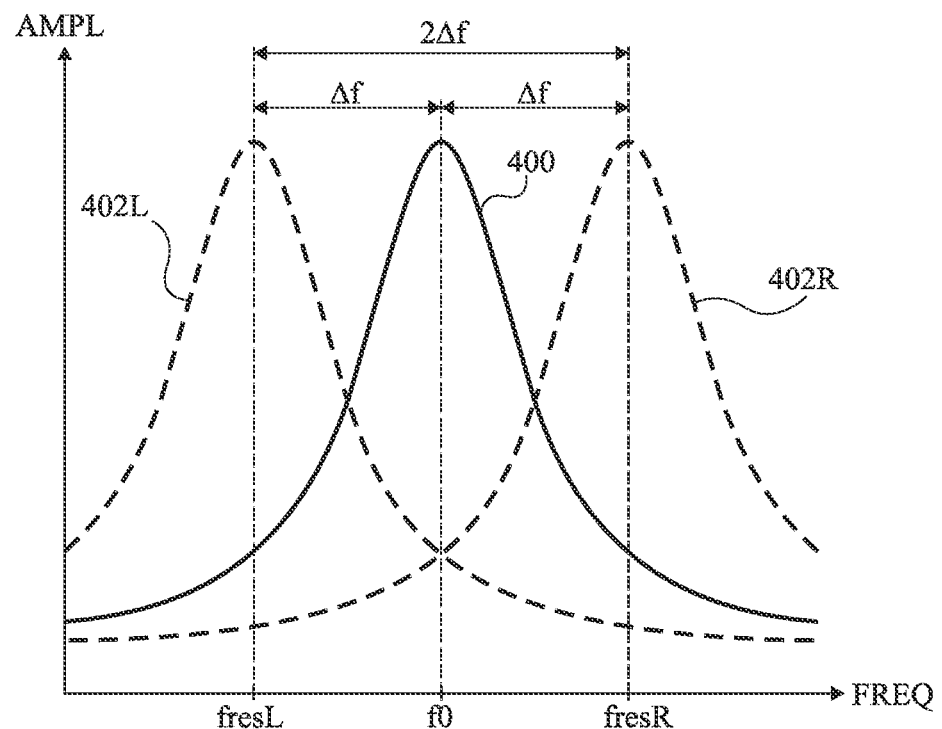
FIG. 4 is a graph showing curves characteristic of the accelerometer of FIG. 2.

FIG. 4 is a graph showing curves characteristic of the accelerometer 200 of FIG. 2. The graph of FIG. 4 more particularly shows amplitude variations (axis of ordinates, AMPL) of the vibrating motions of resonant elements 206L and 206R according to the excitation frequency (axis of abscissas, FREQ) of the resonant elements 206L and 206R of accelerometer 200 controlled by the circuit 300 of FIG. 3.

In FIG. 4:
  a curve 400 in full line represents amplitude variations, according to frequency, of the vibrating motions to which resonant elements 206L and 206R are submitted when seismic mass 202 is at equilibrium; and
  curve 402L and 402R in full line represent amplitude variations, according to frequency, of the vibrating motions to which resonant elements 206L and 206R are respectively submitted when seismic mass 202 is not at equilibrium.

Curves 402L and 402R for example originate from a situation similar to that discussed in relation with FIG. 2, where seismic mass 202 is submitted to an acceleration a2 directed towards anchoring 204L. In this situation, with respect to the position of equilibrium:
  resonance frequency fresL, which decreases because of the compression of resonant element 206L, is then equal to f0−Δf; and resonance frequency fresR, which decreases because of the stretching of resonant element 206R, is then equal to f0+Δf.

The acceleration a2 undergone by seismic mass 202 is then proportional to the difference between the respective resonance frequencies fresL and fresR of resonant elements 206L and 206R, in other words proportional to 2Δf. Accelerometer 200 (FIG. 2) is generally called differential resonant detection accelerometer, the two resonant elements 206L and 206R being positioned so that acceleration a2 is proportional to the offset of their resonance frequencies fresL and fresR.

In the shown example, circuit 302L outputs a sine wave signal of frequency f0+Δf while circuit 302R outputs a sine wave signal of frequency f0−Δf.

In practice, frequency mixer 304 for example enables to obtain:
- a low-frequency signal, having a frequency substantially equal to the phase shift 2Δf between the output signal frequencies of circuits 302L and 302R; and
- another high-frequency signal, having a frequency substantially equal to 2f0.

As an example, one only keeps, at the output of frequency mixer 304, the signal which is the image of offset 2Δf. The high-frequency signal is for example filtered by frequency mixer 304 or by another component (not shown) located downstream of frequency mixer 304, to remove the frequency component 2f0.

An advantage of differential resonant detection accelerometers lies in the fact that they are not sensitive (or are little sensitive) to temperature variations since such variations generally simultaneously affect, in the same way, resonant elements 206L and 206R. Indeed, although a temperature variation can shift resonance frequencies fresL and fresR, this offset, often substantially identical for the two resonant elements 206L and 206R, will have no (or little) influence on the result of the calculation of the difference 2Δf between frequencies fresL and fresR.

Examples of accelerometers 100, 200 where seismic mass 102, 202 is not intentionally submitted to a vibrating motion have been previously described in relation with FIGS. 1 and 2. There however exist other types of accelerometers, for example, resonant accelerometers which comprise at least one seismic mass which is vibrated at its resonance frequency. In this case, a variation of the resonance frequency of the seismic mass enables to trace back the applied acceleration. There exist still other types of accelerometers, particularly resonant detection resonant accelerometers. A system similar to accelerometer 200 which would have its seismic mass 202 vibrated at its resonance frequency is an example of such an accelerometer.

Although this is not detailed in the present description, the features previously described in relation with an example of resonant detection accelerometer 200 can be transposed by those skilled in the art to resonant detection resonant accelerometers. In particular, the adaptation of control circuit 300 to such accelerometers is within the abilities of those skilled in the art based on the above indications.

Figure 5:
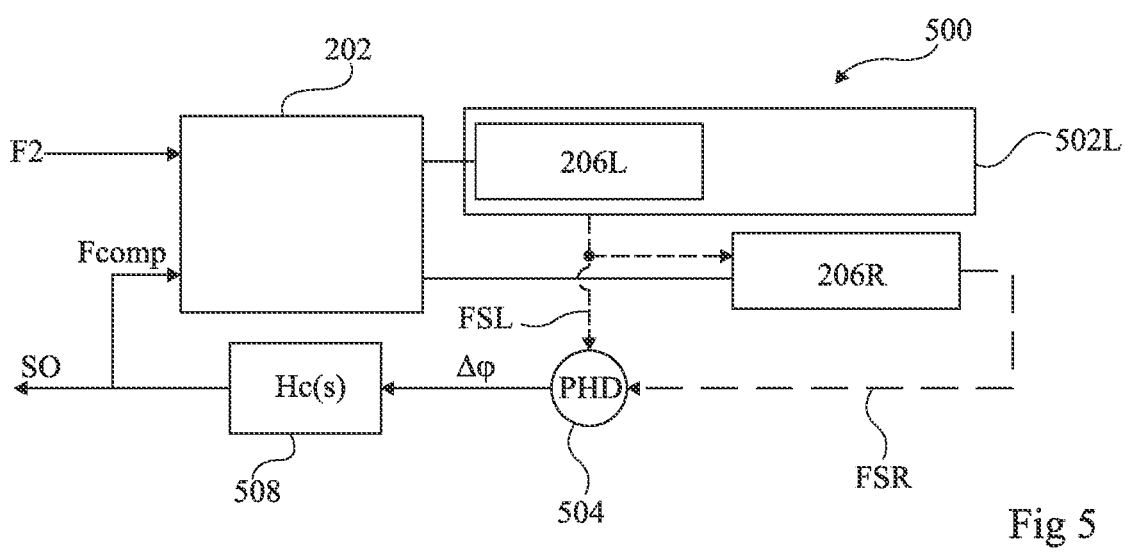
FIG. 5 schematically shows in the form of blocks an embodiment of a sensor control circuit.

FIG. 5 schematically shows in the form of blocks an embodiment of a sensor control circuit 500. Circuit 500 for example forms part of, or is associated with, the accelerometer 200 of FIG. 2.

In FIG. 5, similarly to what has been previously discussed in relation with FIG. 3, one has symbolized:
- in full lines, links conveying analog signals x(t) enabling to code information in the form of an amplitude; and
- in dotted lines, links conveying other analog signals x(t) enabling to code information in the form of a frequency.

According to an embodiment, circuit 500 comprises a block 502L symbolizing a feedback loop, for example, a phase-locked loop (PLL) or self-oscillating loop. The feedback loop 502L of circuit 500 is for example similar to the feedback loops 302L and 302R of circuit 300 discussed in relation with FIG. 3.

In particular, when accelerometer 200 is operating, feedback loop 502L delivers a periodic excitation signal having its frequency adjusted to vibrate resonant element 206L (FIG. 2) at a frequency substantially equal, preferably equal, to its resonance frequency fresL. In circuit 500, an output of feedback loop 502L is used to apply, to resonant element 206R, this same excitation signal of frequency fresL.

In the case where accelerometer 200 is in an equilibrium position, resonant elements 206L and 206R, assumed to be identical, are both in resonance and vibrate in phase at the same frequency f0. In other words, in an equilibrium position, resonant elements 206L and 206R have the same resonance frequency f0 and vibrate, with respect to each other, with a zero phase shift.

In the case where seismic mass 202 is submitted to accelerations, the stress exerted on resonant elements 206L and 206R under the action of the lateral displacements of seismic mass 202 causes a phase shift of the vibrating motions of resonant elements 206L and 206R with respect to each other. In this case, although resonant elements 206L and 206R are both excited at the same frequency fresL, only resonant element 206L is resonating.

This is due to the fact that, unlike the equilibrium position, the resonance frequency fresL of resonant element 206L is in this case, that is, when seismic mass 202 is not at equilibrium, different from the resonance frequency fresR of resonant element 026R. As a result, resonant element 206R then vibrates at the resonance frequency fresL of resonant element 206L, but with a non-zero phase shift with respect to the vibrations of resonant element 206L.

According to an embodiment, circuit 500 comprises a phase detector 504 (PHD) or phase comparator receiving as an input:
- a signal FSL corresponding to the periodic signal of excitation of resonant element 206L at frequency fresL; and
- another signal FSR which is an image of vibrations of resonant element 206R at frequency fresL, phase-shifted with respect to the vibrations of resonant element 206L when accelerometer 200 is submitted to an acceleration.

In the embodiment illustrated in FIG. 5, phase detector 504 receives signal FSL of excitation of resonant element 206L and signal FSR representative of the vibrations, at frequency fresL, of resonant element 206R. As a variant, phase detector 504 receives a signal which is an image of the vibrations of resonant element 206L and signal FSR. Phase detector 504 is configured to estimate a phase shift, noted Δφ, between signals FSL and FSR.

According to an implementation mode, phase shift Δφ is estimated in relative value, the sign of phase shift Δφ then enabling to indicate the direction of the acceleration undergone by the seismic mass 202 of accelerometer 200 (FIG. 2). As a variant, phase shift Δφ is estimated in absolute value, the acceleration being in this case assumed to always be oriented in the same direction.

According to a preferred embodiment, phase shift $\Delta\varphi$ is transmitted to a block 508 (Hc(s)) symbolizing a regulator or corrector configured to apply, to phase shift $\Delta\varphi$, a transfer function Hc(s)).

Block 508 of application of transfer function Hc(s) is for example similar to the block 308 of the circuit 300 of FIG. 3. In particular, the regulator 508 of circuit 500 is preferably a proportional and/or integral and/or derivative regulator, more preferably a proportional integral derivative regulator, or PID regulator. PID regulator 508 enables to submit seismic mass 202 to compensation force Fcomp as discussed in relation with FIG. 3. In the embodiment illustrated in FIG. 5, phase shift $\Delta\varphi$ is used as an error signal of the feedback loop.

The features and advantages of the block 308 of circuit 300 are also applicable to the block 508 of circuit 500. The accelerometer 200 equipped with control circuit 500 particularly has a measurement span, or measurement range, greater than that of an analog sensor having a control circuit comprising no block 508.

An advantage of circuit 500 lies in the fact that it comprises a single feedback loop 502L, to be compared with two feedback loops 302L and 302R in the example of the circuit 300 of FIG. 3. Circuit 500 is accordingly less complex, and likely to be less expensive, than circuit 300.

Another advantage of circuit 500 lies in the fact that it comprises no frequency counter 306, conversely to circuit 300. This further decreases the complexity of circuit 500 with respect to circuit 300.

In practice, the phase detector 504 of circuit 500 may be formed from a simple electronic circuit, for example, a circuit comprising six transistors. Conversely to frequency counter 306, such a phase detector 504 may be deprived of clock signal source and/or of digital components. This advantageously enables to ascertain that circuit 500 is entirely analog, in other words that it comprises no digital component.

Circuit 500 enables, taking advantage of the phase shift $\Delta\varphi$ between the vibrations of resonant elements 206L and 206R, to keep the above-described advantages of resonant detection. Circuit 500 particularly has a performance, for example, a transduction efficiency and a resolution, equivalent to that of circuit 300. However, circuit 500 enables to do away with the disadvantages of resonance frequency measurements such as those performed by circuit 300.

An embodiment of a circuit 500 for controlling an accelerometer 200, where resonant elements 206L and 206R are both excited at the resonance frequency fresL of resonant element 206L by feedback loop 502L has been previously described. This is however not limiting. Those skilled in the art are in particular capable of providing a control circuit configured to excite the resonant elements 206L and 206R of accelerometer 200 at the resonance frequency fresR of resonant element 206R, due to a feedback loop associated with resonant element 206R, and to estimate the corresponding phase shift.

FIG. 6 comprises graphs representing other curves characteristic of the accelerometer 200 of FIG. 2 controlled by the circuit 500 of FIG. 5. More particularly, in FIG. 6:
  a graph shows amplitude variations (axis of ordinates, AMPL) of the vibrating motions of resonant elements 206L and 206R according to the excitation frequency (axis of abscissas, FREQ) of resonant elements 206L and 206R; and
  another graph shows phase variations (axis of ordinates, PHASE) of the vibrating motions of resonant elements 206L and 206R according to the excitation frequency (axis of abscissas, FREQ) of resonant elements 206L and 206R.

In FIG. 6:
  curve 602L and 602R in dotted lines respectively represent amplitude variations and phase variations, according to frequency, of the vibrating motions to which resonant element 206L is submitted when seismic mass 202 is not at equilibrium; and
  curve 600R and 602R in full line respectively represent amplitude variations and phase variations, according to frequency, of the vibrating motions to which resonant element 206R is submitted when seismic mass 202 is not at equilibrium.

The curves 600L and 600R of FIG. 6 are similar to the curves 402L and 402R of FIG. 4. Thus, in FIG. 6, the difference between the resonance frequencies fresL and fresR of resonant elements 206L and 206R, that is, between the tops of curves 600L and 600R, is equal to $2\Delta f$ as previously discussed in relation with FIG. 4.

When seismic mass 202 (FIG. 2) is not at equilibrium, and the resonant elements 206L and 206R of accelerometer 200 are both excited at the resonance frequency fresL of resonant element 206L, $\varphi L$ and $\varphi R$ designate the phases representative of the vibrations to which resonant elements 206L and 206R are respectively submitted. As illustrated in FIG. 6, phase shift $\Delta\varphi$ here represents by convention the interval $\varphi L-\varphi R$, estimated vertically in line with the point of inflexion of curve 602L at frequency fresL, between curves 602L and 602R. As previously discussed, phase shift $\Delta\varphi$ may be considered in relative value or in absolute value, according to whether it is desired or not to determine the direction of the acceleration.

In the example of FIG. 6, at frequency fresL, phase $\varphi L$ is smaller than phase $\varphi R$. In relative value, according to convention $\Delta\varphi=\varphi L-\varphi R$, phase shift $\Delta\varphi$ is then negative. This corresponds to a displacement of the seismic mass 202 of accelerometer 200 towards anchoring 204L, that is, leftwards in the orientation of FIG. 2.

Although this is not shown in FIG. 6, when seismic mass 202 is in a position of equilibrium:
  resonance frequencies fresL and fresR are equal to f0, offset $\Delta f$ is thus zero, and curves 600L and 600R are then superimposed; and
  phases $\varphi L$ and $\varphi R$ are equal, phase shift $\Delta\varphi$ is thus zero, and curves 602L and 602R are then superimposed.

An embodiment of a circuit 500 for controlling an example of accelerometer 200 (FIG. 2) where seismic mass 202 applies stress onto resonant elements 206L and 206R by a direct mechanical coupling has been described in relation with FIGS. 5 and 6. Circuit 500 may however control other examples of accelerometers (not shown), where seismic mass 202 applies stress onto resonant elements 206L and 206R:
  by an indirect mechanical coupling, for example, due to one or a plurality of levers; or
  by an electric coupling, the motion of seismic mass 202 then causing a variation of an electric field interacting with each resonant element 206L, 206R.

It may further be provided for circuit 500 to control still other examples of accelerometers (not shown), in particular:
  accelerometers comprising a seismic mass having two vibration modes coupled to the acceleration; and
  accelerometers comprising at least two resonating seismic masses, having their resonance frequencies coupled to the acceleration.

More generally, advantage may be taken of circuit 500 to control any type of sensor where a physical quantity causes a phase difference between a resonator and at least two other resonators, where the resonant may be coupled to at least one seismic mass or be directly formed by vibrating seismic masses.

An embodiment of a circuit 500 for controlling an example of accelerometer 200 (FIG. 2) where the two resonant elements 206L and 206R have the same resonance frequency in an equilibrium position has further been described hereabove in relation with FIGS. 5 and 6. When accelerometer 200 is submitted to an acceleration a2, each resonant element 206L, 206R is submitted to an identical resonance frequency variation fresL, fresR, but for the sign (fresL=f0−Δf and fresR=f0+Δf).

According to the embodiment of FIG. 5, circuit 500 then applies a compensation force Fcomp having an amplitude equal and a sign opposite to that of the force F2 resulting from acceleration a2. This thus enables to bring seismic mass 202 back to the equilibrium position (Δf=0), where resonance frequencies fresL and fresR are both equal to f0.

According to another embodiment, the two resonant elements 206L and 206R of the accelerometer 200 of FIG. 2 have the same resonance frequency f0 in the equilibrium position, but have a different sensitivity to acceleration. In this case, it may for example be ascertained that, when accelerometer 200 is in operation and is submitted to acceleration a2:

the resonance frequency fresL of resonant element 206L is equal to f0−Δf; and
the resonance frequency fresR of resonant element 206R is equal to f0+N·Δf, where N is preferably a non-zero natural integer.

As a variant, it may be provided that only one of the two resonant elements 206L, 206R, for example, resonant element 206L, is sensitive to acceleration. In other words, this amounts to ascertaining that resonant element 206R is not sensitive to acceleration. This then comes down to a specific case of the previous embodiment, for which N=0.

FIG. 7 is a partial simplified perspective view of still another example of an accelerometer 700 of the type to which described embodiments apply as an example.

In the example of FIG. 7, accelerometer 700 comprises three seismic masses 702x, 702y, and 702z similar to the seismic mass 102 of accelerometer 100 (FIG. 1). In FIG. 7, seismic masses 702x, 702y, and 702z are respectively coupled to fixed elements or anchorings 704x, 704y, and 704z by transducers or transduction elements 706x, 706y, and 706z. Transduction elements 706x, 706y, and 706z are similar to the resonant elements 206L and 206R of accelerometer 200 (FIG. 2). In particular, transduction elements or resonant elements 706x, 706y, and 706z, may have dimensions similar to those of resonant elements 206L and 206R. It is assumed, for simplification, that resonant elements 706x, 706y, and 706z are identical to one another, to within manufacturing dispersions.

In the orientation of FIG. 7, resonant elements 706x, 706y, and 706z are respectively arranged along three orthogonal axes Ox, Oy, and Oz forming a right trihedron Oxyz. Thereby, accelerometer 700 is capable of detecting accelerations in the three directions of space. Accelerometer 700 is then called three-axis sensor, or triaxis sensor.

FIG. 7 shows an example of an accelerometer 700 having each of its resonant elements 706x, 706y, 706z coupled to a seismic mass 702x, 702y, 702z which is specific thereto. However, those skilled in the art are capable of adapting what is described hereafter in relation with accelerometer 700 to other types of accelerometers, particularly to accelerometers (not shown) where at least two resonant elements are coupled to a same seismic mass and, more particularly, to examples of accelerometers where resonant elements 706x, 706y, and 706z are all three coupled to a same mechanical mass.

Figure 8:
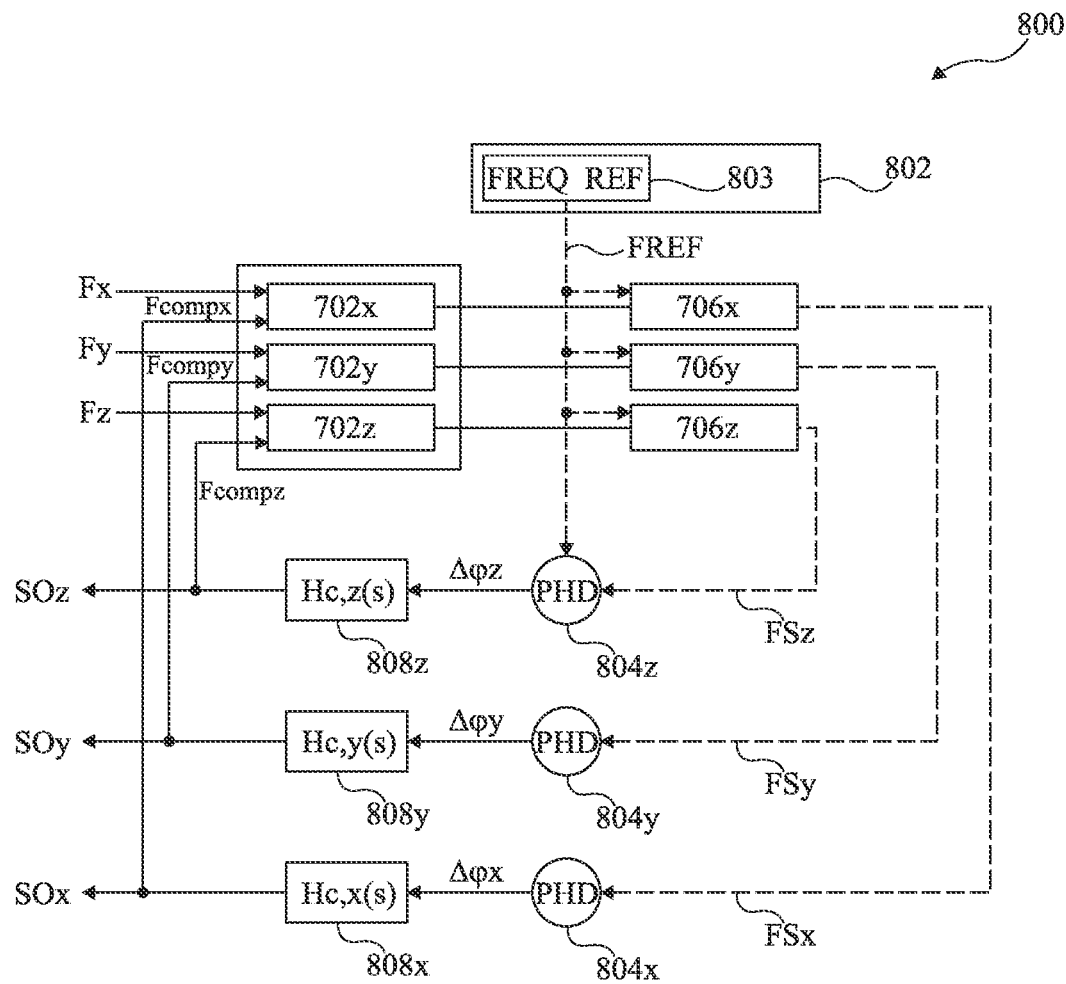
FIG. 8 schematically shows in the form of blocks another embodiment of a sensor control circuit.

FIG. 8 schematically shows in the form of blocks another embodiment of a sensor control circuit 800. Circuit 800 for example forms part of, or is associated with, the accelerometer 700 of FIG. 7.

In FIG. 8, similarly to what has been previously discussed in relation with FIG. 3, one has symbolized:

in full lines, links conveying analog signals x(t) enabling to code information in the form of an amplitude; and
in dotted lines, links conveying analog signals x(t) enabling to code information in the form of a frequency.

Circuit 800 comprises a block 802 symbolizing a feedback loop configured to adjust the excitation frequency of a resonant element 803 (FREQ REF). According to an embodiment, resonant element 803 is an oscillator and loop 802 is for example a self-oscillating loop or a phase-locked loop. The feedback loop 802 of circuit 800 is for example similar to the feedback loops 302L and 302R of the circuit 300 discussed in relation with FIG. 3.

According to an embodiment, resonant element 803 is mechanically uncoupled from accelerometer 70, so that resonant element 803 is not sensitive to the accelerations to which accelerometer 700 is submitted. Resonant element 803 is for example similar to resonant elements 706x, 706y, and 706z (FIG. 7), where resonant element 803 is however not mechanically coupled to any of the seismic masses 702x, 702y, and 702z of accelerometer 700.

When accelerometer 700 is operating, resonant element 803 is submitted to a periodic excitation signal FREF having a frequency substantially equal, preferably equal, to its resonance frequency. In the case where resonant elements 803, 706x, 706y, and 706z are identical to one another, the frequency of signal FREF is further substantially equal, preferably equal, to the resonance frequency of resonant elements 706x, 706y, and 706z in an equilibrium position, that is, when accelerometer 700 is submitted to no acceleration.

In the present description, it is assumed for simplification that resonant elements 706x, 706y, and 706z all have, in an equilibrium position, a resonance frequency equal to that of resonant element 803. However, in practice, this is not necessarily true. The resonance frequency of resonant element 803 may in particular be different from that of resonant elements 706x, 706y, and 706z at equilibrium. The resonance frequencies of resonant elements 706x, 706y, and 706z at equilibrium may further be different from one another. These differences are for example estimated and taken into account by circuit 800 during calibration steps that may occur after the manufacturing of accelerometer 700 and/or during the use of accelerometer 700.

In the case where accelerometer 700 is in an equilibrium position, resonant elements 803, 706x, 706y, and 706z are assumed to be resonating and all vibrate in phase at the same frequency. In other words, in an equilibrium position, resonant elements 803, 706x, 706y, and 706z vibrate with respect to one another with a zero phase shift.

In the case where seismic mass 702x, 702y, 702z is submitted to an acceleration along axis Ox, Oy, Oz, the stress Fx, Fy, Fz exerted on resonant element 706x, 706y, 706z under the action of the lateral displacement of seismic mass 702x, 702y, 702z causes a phase shift of the vibrating motions of resonant element 706x, 706y, 706z with respect to periodic signal FREF, assumed to be unchanged. This is due to the fact that the resonance frequency when resonant element 706x, 706y, 706z is not at equilibrium is different from the resonance frequency of this same resonant element 706x, 706y, 706z when seismic mass 702x, 702y, 702z is in an equilibrium position.

According to an embodiment, circuit 800 comprises phase detectors 804x, 804y, and 804z (PHD). Phase detector 804x, 804y, 804z receives as an input:
- the periodic signal FREF of excitation of resonant element 803; and
- another signal FSx, FSy, FSz which is an image of the vibrations of resonant element 706x, 706y, 706z, these vibrations being phase-shifted with respect to signal FREF when seismic mass 702x, 702y, 702z is not at equilibrium.

In the embodiment illustrated in FIG. 8, each phase detector 804x, 804y, 804z is specific to one of resonant elements 706x, 706y, and 706z. Phase detector 804x, 804y, 804z is configured to estimate a phase shift, noted $\Delta\varphi x$, $\Delta\varphi y$, $\Delta\varphi z$, between the image signal FSx, FSy, FSz of the vibrations of resonant element 706x, 706y, 706z and reference signal FREF. According to a preferred embodiment, phase shift $\Delta\varphi x$, $\Delta\varphi y$, $\Delta\varphi z$ is then transmitted to a block 808x (Hc,x(s)), 808y (Hc,y(s)), 808z (Hc,z(s)) symbolizing the application of a transfer function Hc,x(s), Hc,y(s), Hc,z(s).

According to an embodiment, it is ascertained that, when sensor 700 is operating, the resonance frequency of resonant element 803 and the resonance frequency 706x, 706y, 706z of resonant element are close, and in each other's bandwidths. More particularly, assuming that resonant element 803 has a resonance frequency f1 and a quality factor Q1 and that resonant element 706x, 706y, 706z has, out of the equilibrium position, a resonance frequency f2 and a quality factor Q2, it is preferably ascertained that $|f1-f2|<(f1/Q1)$ and that $|f1-f2|<(f2/Q2)$.

Block 808x, 808y, 808z of application of transfer function Hc,x(s), Hc,y(s), Hc,z(s) is for example similar to the block 308 of the circuit 300 of FIG. 3. Similarly to what has been discussed in relation with FIG. 3, the transfer function Hc,x(s), Hc,y(s), Hc,z(s) applied by the block 808x, 808y, 808z of circuit 800 is preferably a PID (proportional, integral, derivative) regulation function enabling to submit seismic mass 702x, 702y, 702z to a compensation force Fcompx, Fcompy, Fcompz. In the embodiment illustrated in FIG. 8, phase shift $\Delta\varphi x$, $\Delta\varphi y$, $\Delta\varphi z$ is used as an error signal of the feedback loop.

The features and advantages of the block 308 of circuit 300 are also applicable to the blocks 808x, 808y, and 808z of circuit 800. The accelerometer 700 equipped with control circuit 800 however has a measurement span, or measurement range, greater than that of an accelerometer which would have its control circuit deprived of blocks 808x, 808y, and 808z.

In practice, compensation force Fcompx, Fcompy, Fcompz is for example an electrostatic force exerted on the seismic mass 702x, 702y, 702z by one or a plurality of electrodes (not shown). In the example of FIG. 8, circuit 800 generates output signals SOx, SOy, and SOz which are for example equal or proportional to electric voltages used to apply electrostatic forces Fcompx, Fcompy, and Fcompz, respectively.

In circuit 800, reference resonant element 803 is not sensitive to accelerations while the three other resonant elements 706x, 706y, and 706z are sensitive, respectively, to accelerations along axes Ox, Oy, and Oz. Each resonant element 706x, 706y, 706z has its own feedback loop enabling to generate compensation force Fcompx, Fcompy, Fcompz along the considered axis Ox, Oy, Oz. The phase shift $\Delta\varphi x$, $\Delta\varphi y$, $\Delta\varphi z$ of each resonant element 706x, 706y, 706z is then compared with the reference resonant element 803. This advantageously enables to compensate for temperature drifts likely to affect accelerometer 700.

Generally, the higher the number of resonant elements of an accelerometer, the more the use of a circuit of the type of the circuit 800 discussed in relation with FIG. 8 is advantageous. This is particularly due to the fact that circuit 800 uses a reference resonant element 803 which is common to all the other resonant elements 706x, 706y, 706z of accelerometer 700.

An embodiment of a circuit 800 having a resonant element 803 and resonant elements 706x, 706y, and 706z having the same resonance modes has been described hereabove in relation with FIG. 8.

According to another embodiment, resonant element 803 is different from resonant elements 706x, 706y, and 706z, but resonant element 803 and resonant elements 706x, 706y, and 706z have at least one resonance mode at the same frequency.

According to still another embodiment, resonant element 803 is different from resonant elements 706x, 706y, and 706z, but resonant element 803 and resonant elements 706x, 706y, and 706z have proportional resonance frequencies. In this case, the resonance frequency f2 of each resonant element 706x, 706y, 706z is for example a multiple of the resonance frequency f1 of resonant element 803 ($f2=N\cdot f1$, where N is a natural integer greater than 1). Circuit 800 then preferably comprises a frequency multiplier (not shown) at the output of resonant element 803.

In circuit 800, one of resonant elements 803, 706x, 706y, and 706z (resonant element 803, according to the embodiment illustrated in FIG. 8) is made to resonate due to a control or feedback loop (loop 802, still according to this embodiment). This advantageously enables to make sure that signal FREF is always maintained at the resonance frequency f1 of resonant element 803 even in case of a frequency drift due, for example, to a temperature variation.

As a variant, resonant element 803 is not driven by feedback loop 802. Resonant element 803 is then for example controlled by a self-oscillator or by a frequency generator. In this case, it is for example assumed that accelerometer 700 is not sensitive to temperature variations.

According to still another embodiment, at least one resonant element, from among reference resonant element 803 and resonant elements 706x, 706y, and 706z, has a mechanism (not shown) for regulating its resonance frequency. In this case, this advantageously enables to compensate for a bias likely to affect accelerometer 700 in an equilibrium position.

For example, at least one temperature sensor measures the temperature of accelerometer 700 (FIG. 7) and/or of circuit 800 (FIG. 8). In this case, the resonance frequency f1 of resonant element 803 is for example adjusted according to the temperature measured by the sensor.

According to still another embodiment, the compensation of the bias likely to affect accelerometer 700 in an equilibrium position is performed due to the application of a static compensation force adding to, or cumulating with, at least one of compensation forces Fcompx, Fcompy, and Fcompz.

An embodiment of a circuit 800 having its compensation force Fcompx, Fcompy, Fcompz originating from a transfer function PID-type Hc,x(s), Hc,y(s), Hc,z(s) has been described hereabove in relation with FIG. 8. Transfer function Fcompx, Fcompy, Fcompz originates from a PID-type transfer function Hc,x(s), Hc,y(s), Hc,z(s).

According to another embodiment, the signal representative of phase shift Δφx, Δφy, Δφz is previously digitized. In this case, the application of transfer function Hc,x(s), Hc,y(s), Hc,z(s) is preferably performed by a digital block 808x, 808y, 808z.

As a variant, each of signals FSx, FSy, FSz is digitized before the associated phase detector 804x, 804y, 804z. It will be within the abilities of those skilled in the art to adapt circuit 800 to this variant.

Generally, the output signals SOx, SOy, and SOz of circuit 800 are generated from the output signals of blocks 808x, 808y, and 808z of application of transfer functions Hc,x(s), Hc,y(s), and Hc,z(s), respectively.

According to an embodiment, the output signals SOx, SOy, and SOz of circuit 800 are identical to the output signals of blocks 808x, 808y, and 808z.

According to another embodiment, the output signals SOx, SOy, and SOz of circuit 800 are proportional to the output signals of blocks 808x, 808y, and 808z.

More generally, according to still another embodiment, the output signals SOx, SOy, and SOz of circuit 800 are a function of the output signals of blocks 808x, 808y, and 808z. Output signal SOx, SOy, SOz for example depends on the output signal of block 808x, 808y, 808z according to a polynomial function, for example, a polynomial function of order two.

An example of an accelerometer 700 having its resonant elements 706x, 706y, and 706z directly coupled to seismic masses 702x, 702y, and 702z, respectively, has been described hereabove in relation with FIG. 7.

In another example (not shown), the accelerometer comprises at least one seismic mass mechanically coupled to two identical beams by a lever arm having a gain noted F. In this case, an acceleration, noted a, communicated to the seismic mass causes, on the beams, opposite stress having an amplitude Tacc proportional to aF. The beams are then used as resonators having a resonance frequency, noted fR, varying according to an equation of the type:

$$fR = f0 + \sqrt{k \cdot Tacc} \quad (3)$$

In the above equation 3, f0 represents the resonance frequency in equilibrium position, that is, the resonance frequency of each beam in the absence of stress (Tacc=0), and k represents a factor depending on the beam geometry. Under the effect of acceleration a, the two resonators are submitted to stress which results in modifying their respective resonance frequencies. It is then come down to a case similar to what has been previously described in relation with the accelerometer 200 of FIG. 2.

Various embodiments and variants have been described. Those skilled in the art will understand that certain features of these various embodiments and variants may be combined, and other variants will occur to those skilled in the art. In particular, it will be within the abilities of those skilled in the art to adapt circuits 500 and 800 to embodiments of accelerometers comprising any number of seismic masses and of resonant elements. The embodiments described in relation with accelerometer 700 and circuit 800 are further transposable by those skilled in the art to accelerometer 200 and to circuit 500.

Further, what has been more particularly described in relation with examples of applications to accelerometers more generally applies to other resonant detection sensors, particularly, resonant detection gyrometers for which it is desired to obtain a coupling of at least two resonators, or resonance modes, having as accurate a resonance frequency offset as possible to achieve a better performance. In this case, the feedback loops are preferably used to modify the resonance frequency of one of the modes, to be able to optimize the frequency difference.

Finally, the practical implementation of the described embodiments and variants is within the abilities of those skilled in the art based on the functional indications given hereabove. In particular, the selection of the values of the excitation frequencies of the resonant elements is within the abilities of those skilled in the art.

What is claimed is:

1. Method of controlling a microelectromechanical sensor, comprising the steps of:
   exciting, with a same first signal, a first resonant element and at least one second resonant element; and
   estimating a phase shift between the first signal and a second signal which is an image of vibrations of the second resonant element, wherein said first and said at least one second resonant elements are located on either side of a seismic mass along an axis, the sensor being capable of detecting accelerations having a non-zero component when projected on said axis.

2. Method according to claim 1, wherein, at equilibrium, the first and second resonant elements vibrate with a zero phase shift with respect to each other.

3. Method according to claim 1, wherein the first signal is periodic and has a frequency substantially equal, preferably equal, to a resonance frequency of the first resonant element.

4. Method according to claim 3, wherein the second resonant element has, when the sensor is in a position of equilibrium, a resonance frequency substantially equal, preferably equal, to the resonance frequency of the first resonant element.

5. Method according to claim 1, wherein the first signal is imposed to the first resonant element by a feedback loop.

6. Method according to claim 1, wherein the phase shift is estimated by a phase detector specific to each second resonant element.

7. Method according to claim 1, wherein the sensor comprises one or a plurality of seismic masses, each second resonant element being coupled to said or to one of said seismic masses.

8. Method according to claim 7, further comprising a step comprising exerting a feedback force on each seismic mass.

9. Method according to claim 8, wherein the feedback force is generated by a feedback loop comprising a regulator, preferably a proportional and/or integral and/or derivative regulator, more preferably a proportional integral derivative regulator.

10. Method according to claim 7, wherein the first resonant element is mechanically uncoupled from said seismic mass(es).

11. Circuit adapted to implementing the method according to claim 1.

12. Microelectromechanical sensor comprising at least one circuit according to claim 11.

13. One-axis sensor according to claim 12, comprising exactly one second resonant element and one phase detector.

14. Three-axis sensor according to claim 12, comprising three second resonant elements and three phase detectors.

15. Accelerometer comprising at least one sensor according to claim 12.

16. Gyrometer comprising at least one sensor according to claim 12.

* * * * *